United States Patent [19]

Doyle et al.

[11] Patent Number: 5,650,258
[45] Date of Patent: Jul. 22, 1997

[54] IMAGE FORMATION

[76] Inventors: Stephen Bernard Doyle, 7 Village Gardens, Colton, Leeds, United Kingdom, LS15 9BL; Allen Peter Gates, 13 Fountains Way, Knaresborough, United Kingdom, HG5 8HU; John Michael Kitteridge, 24 Hathaway Drive, Leeds, United Kingdom, LS14 2DJ; Philip John Watkiss, 5 Hollin Crescent, Leeds, United Kingdom, LS16 5ND

[21] Appl. No.: 497,586

[22] Filed: Jun. 30, 1995

[30] Foreign Application Priority Data

Jun. 30, 1994 [GB] United Kingdom ............ 9413197

[51] Int. Cl.⁶ .................................... G03C 8/00
[52] U.S. Cl. .................... 430/204; 430/264; 430/276.1; 430/278.1; 430/300; 430/3; 430/302; 430/525
[58] Field of Search ........................ 430/300, 302, 430/204, 264, 276, 278, 525; 101/459

[56] References Cited

U.S. PATENT DOCUMENTS

| | | | |
|---|---|---|---|
| 4,065,364 | 12/1977 | Fromson | 204/15 |
| 4,115,118 | 9/1978 | Kubotero et al. | 430/264 |
| 4,879,201 | 11/1989 | Hasegawa | 430/138 |
| 5,427,889 | 6/1995 | Saikawa et al. | 430/204 |

FOREIGN PATENT DOCUMENTS

| | | |
|---|---|---|
| 0 115 678 A2 | 8/1984 | European Pat. Off. . |
| 0 131 462 A3 | 1/1985 | European Pat. Off. . |
| 0 155 849 A2 | 9/1985 | European Pat. Off. . |
| 0 278 766 A3 | 8/1988 | European Pat. Off. . |
| A-0 519 123 | 12/1992 | European Pat. Off. . |
| A-0 629 919 | 12/1994 | European Pat. Off. . |
| 1 017 659 | 1/1966 | United Kingdom . |
| A-1 547 040 | 6/1979 | United Kingdom . |
| 1 561 378 | 2/1980 | United Kingdom . |
| 2 052 084 A | 1/1981 | United Kingdom . |
| 1 590 058 | 5/1981 | United Kingdom . |
| 93/10979 | 6/1993 | WIPO . |

OTHER PUBLICATIONS

Preliminary Examination and Search on Application No. GP 9413197.6.

Research Disclosure, Jun. 1979, p. 306.

*Primary Examiner*—Geraldine Letscher

[57] ABSTRACT

Laminates of aluminum and plastic form the substrate of printing plate precursors that are suitable for imaging in conventional roll-fed imagesetters or phototypesetters.

8 Claims, No Drawings

IMAGE FORMATION

FIELD OF THE INVENTION

This invention relates to image formation and, more particularly, to a method of image formation employing roll-fed imagesetters or phototypesetters.

BACKGROUND OF THE INVENTION

It has been a long term objective in the printing industry to form images directly from an electronically composed digital database by a "computer-to-plate" system. The advantages of such a system, over the traditional methods of making printing plates, would be:

(i) the elimination of costly intermediate film and processing chemicals;

(ii) a saving of time; and (iii) the ability to automate the system with consequent reduction in labor costs.

The advent of imagesetters and phototypesetters has increasingly afforded the opportunity of forming an image directly on a printing plate precursor without the need for an intermediate film-making stage. Such devices are employed to output fully paginated text and graphic images at a high resolution, employing various techniques for image creation. Computerized signals are employed for image formation, which enable one to achieve significant improvements in cost, efficiency and quality.

The majority of the existing imagesetters and phototypesetters are roll fed units designed for the exposure of film or paper, rather than less flexible aluminum-based lithographic printing plates. Certain plastic-based printing plates, such as the Mitsubishi Silver Master, can be processed through imagesetters, but these plates have disadvantages of poor dimensional stability, making them unsuitable for full color printing. The plastic-based printing plates also offer poor lithographic properties compared to conventional aluminum-based lithographic plates.

In general, it is found that plastic sheet, such as polyethylene terephthalate, has good flexibility, making it suitable for processing through imagesetters, but suffers from inadequate hydrophilicity, dimensional stability and coating adhesion for lithographic printing plate applications. On the other hand, aluminum sheet, especially when grained and anodized, is suitable for almost all requirements for a supporting substrate of a presensitized lithographic printing plate, giving excellent hydrophilicity, dimensional stability and coating adhesion. Aluminum does, however, have the disadvantage of limited flexibility.

Thus, there is an ongoing need for a process for making high quality lithographic printing plates using roll-fed imagesetters or phototypesetters.

SUMMARY OF THE INVENTION

It has now been found that certain laminates of aluminum and plastic have the requisite dimensional stability to function well as a lithographic printing plate substrate, yet are not so dense or stiff that the laminates cannot readily be imaged in conventional roll-fed imagesetters or phototypesetters. Accordingly, the present invention provides a method of preparing an imaged lithographic printing plate by the sequential steps of:

(a) providing a roll of a printing plate precursor comprising:

(i) a base substrate comprising a laminate of a 10 to 50 µm aluminum sheet and a 25 to 250 µm plastic sheet, and (ii) a photosensitive layer containing silver halide adhered to the aluminum;

(b) imagewise exposing the photosensitive layer of said printing plate precursor by means of a roll-fed imagesetter or phototypesetter; and (c) processing the exposed printing plate precursor to provide hydrophilic non-image areas and oleophilic image areas.

DETAILED DESCRIPTION OF THE INVENTION

Imagesetters generally are designed to be used with high speed silver halide film or paper fed to the imagesetter in roll form. The comparatively high sensitivity of silver halide compositions to light, compared to conventional photopolymer materials, and the ability of silver halide compositions to respond to light from ultra-violet to infra-red, make them ideally suited for use in printing plate applications where direct-to-plate exposure is employed rather than exposure through a contact film intermediate.

The laminate substrates that are employed in practicing the invention have sufficient dimensional stability to facilitate their use in lithographic printing plates, but the substrates are substantially lighter and more flexible than conventional aluminum substrates, and thus may readily be fed in roll-form to roll-fed imagesetters or phototypesetters. It will be appreciated by those skilled in the art that conventional imagesetters and phototypesetters are designed to image feedstock having a thickness of 100 to 300 µm, typically about 150 µm. Not only would it be difficult to form printing plates having an aluminum substrate into rolls of that thickness, but the rolls would be so heavy and inflexible that they could not be readily imaged by conventional imagesetters or phototypesetters.

Composite sheets of aluminum and plastic per se are well known in the prior art. See, for example, European patent nos. 115,678; 155,849 and 136,903. Laminates in which the aluminum additionally is grained and anodized are described in U.S. Pat. Nos. 4,065,364 and 4,680,250, and in Research Disclosure 18,219, June 1979, page 306. Previously, however, such substrates have not found widespread application in conventional film-based printing techniques, due to the higher cost of laminate in relation to aluminum. As previously noted, of course, substrates made solely from aluminum would be totally unsuitable for present purposes, due to their lack of flexibility.

The laminates of use in the present invention preferably are those in which aluminum is laminated to a plastic film by means of an adhesive. Any conventional adhesive known in the art may be used, for example a polyurethane adhesive. The thickness of the adhesive layer typically lies in the range between 2 and 20 µm.

Suitable plastics for use in the laminate include polyethylene, polyamides and polyesters, but the preferred material, on the grounds of low cost and favorable physical properties, is polyethylene terephthalate (marketed as Mylar® by DuPont and Melinex® by ICI). The thickness of the plastic can be in the range from 25 to 250 µm, preferably 100 to 150 µm. A layer of antistatic material optionally is present on the back surface of the plastic.

For practical reasons, the thickness of the aluminum laminated to the plastic is between 10 and 50 µm; layers of greater than 50 µm thickness have insufficient flexibility, whereas problems with layer continuity can arise when layer thickness is less than 10 µm. The preferred range of aluminum thickness is between 20 and 30 µm. A typical 150 µm plate would have approximately 125 µm plastic and 25 µm aluminum.

Various grades of aluminum may be used, for example 1200 grade (99.2% Al content) or 1050 grade (99.5% Al content). The aluminum may optionally be heat-treated in order to control hardness. The aluminum is grained and anodized in order to render the surface sufficiently hydrophilic for lithographic printing and to ensure good adhesion between the substrate and the photosensitive coating. Various graining techniques are available, such as brush graining and chemical graining, but electrochemical graining in acid solution is preferred. Graining acids may include, for example, hydrochloric acid or nitric acid, or preferably, a mixture of hydrochloric acid and acetic acid. After graining, the aluminum is anodized in, for example, phosphoric acid, or more preferably, sulphuric acid. Optionally, the aluminum may also be cleaned prior to graining by treatment with, for example, sodium hydroxide, and prior to anodizing by treatment with, for example, phosphoric acid. It is preferred that, after graining and anodizing, the aluminum substrate should comply with the specifications set out in European patent no. 278,766, in terms of the relationship between the anodic weight and the surface roughness, as measured by the center line average.

The laminate is coated with a high speed silver halide coating, and is thus capable of being converted into a printing plate. Silver halides, in the context of the present invention, may be used in a variety of ways. Suitable coatings include, for example, the single sheet diffusion transfer type, as described in European patent nos. 131,462 and 278,766, in which a developer is applied to chemically develop exposed areas of a photosensitive coating, while at the same time physically developing the unexposed areas. In the unexposed areas soluble silver complexes diffuse to a nucleation layer where metallic silver is formed by reduction and can be made oleophilic for use as the printing image of a lithographic printing plate.

Tanning development type coatings, such as described in British patent nos. 1,547,040; 1,547,350; 1,567,844; 1,571,155; and 1,590,058, and which comprise a silver halide in combination with gelatin or other matrix binder, are also suitable for the purposes of the present invention. Such systems involve oxidized developing agent, which is generated on development of exposed silver halide, crosslinking the gelatin or other matrix binder, so providing a tough, ink-receptive image.

Amongst other suitable coatings which can be employed in the present invention are coatings which employ a silver halide layer as a mask on top of a conventional photopolymerizable layer, such as described in British patent nos. 1,227,603; 2,052,084; 2,057,154 and 2,065,318, coatings which involve crosslinking of polymers on development, such as described in British patent no. 2,040,060 and European patent no. 52,942, and coatings which rely on silver halide initiation of polymerization on development, such as described in U.S. Pat. Nos. 4,547,450; 4,859,568 and 4,879,201.

The lithographic printing plate comprising a silver halide-containing photosensitive layer coated on an aluminum/polyester laminate thus combines the sensitivity of silver halide systems and the advantageous printing properties of grained and anodized aluminum with flexibility to be transported through standard imagesetters. The plate exhibits greater dimensional stability than a polyester-based plate and greater flexibility than an aluminum-based plate by virtue of the mid-point position of its Young's Modulus (Table 1).

TABLE 1

| Substrate | Young's Modulus (GPa) |
| --- | --- |
| Aluminum (Al) | 67 |
| Polyethylene terephthalate (PET) | 3.8 |
| Laminate (5 Al:1 PET) | 16 |

It is the modulus of the laminated material which allows it to be transported by common imagesetters, for example the Linotype 300 and 500 series, while at the same time providing four times the strength exhibited by non-laminated polyester film. A further consequence of the increased strength is noted in the greater ease with which correct register may be achieved and maintained during color printing.

Examples of commercial imagesetters which are compatible with the laminated plates of the invention, but not compatible with aluminum-based plates, are shown in Table 2.

TABLE 2

| Manufacturer | Machine | Type |
| --- | --- | --- |
| Agfa | Compugraphic | Helium-Neon |
|  | Selectset 500 | Helium-Neon |
|  | Selectset 700 | Helium-Neon |
| Barco | BG3700 | Helium-Neon |
|  | BG3800 | Helium-Neon |
| Crosfield | Studiowriter 650 | Argon Ion |
|  | Studiowriter 1000 | Argon Ion |
| ECRM | Pellbox | Helium-Neon |
| Hell | Digiset | Argon Ion |
| Linotype | 300 | Helium-Neon |
|  | 330 | Helium-Neon |
|  | 500 | Helium-Neon |
|  | 830 | Argon Ion |
|  | 930 | Argon Ion |
| Monotype | Lasercomp | Helium-Neon |
| Optronics | Colorsetter 2000 | Argon Ion |
|  | Colorsetter XL | Argon Ion |
| Purup | PE5000/7000 | Argon Ion |
|  | PIM Blue | Argon Ion |
| Scitex | Dolev 200 | Helium-Neon |
|  | Dolev 400 | Helium-Neon |
|  | Dolev 800 | Helium-Neon |
|  | ERAY | Argon Ion |
|  | Raystar | Argon Ion |

The following examples are illustrative of the invention:

EXAMPLE 1

25 μm Aluminum foil (grade 1200) was laminated with a polyurethane adhesive to 125 μm Mylar® film. The aluminum surface was cleaned in sodium hydroxide solution, electrochemically grained in an electrolyte of hydrochloric and acetic acids by means of alternating current to give a CLA of 0.6 μm, cleaned in phosphoric acid solution, and anodized in sulphuric acid solution to give an anodic weight of 4.0 g/m$^2$.

The grained and anodized aluminum was coated with a thin layer of colloidal silver made by the Carey Lea method to give a coating weight of about 3.0 mg/m$^2$. This was followed by a coating of a light sensitive, high contrast, silver chlorobromide emulsion comprising 80 mole % chloride and 20 mole % bromide with a silver to gelatin ratio of 1:1. A merocyanine dye spectrally sensitizing to 488 nm was included in the emulsion. The emulsion was cast onto the colloidal silver layer to give a coating weight of 4.0 g/m$^2$.

The laminate was imaged on a Purup PE5000 imagesetter, developed in developer A for 30 seconds at 25° C., the exposed areas were removed by scrubbing with water, and the plate was treated with finisher A.

| Developer A | |
|---|---|
| Sodium sulphite | 110 g |
| Hydroquinone | 20 g |
| Phenidone B | 6 g |
| Sodium hydroxide | 18.5 g |
| Sodium thiosulphate | 10 g |
| 2-Methylaminoethanol | 30 ml |
| Water | to 1 liter |
| Finisher A | |
| Borax | 4.77 g |
| 0.1M Hydrochloric acid | 200 ml |
| Trypsin | 10 g |
| Gum Arabic solution | 150 ml |
| Calcium nitrate | 0.5 g |
| Polyethylene glycol 200 | 100 ml |
| Phenylmercaptotetrazole | 2.0 g |
| Water | to 1 liter |

The laminate was placed on a Didde Glaser web offset press. 50,000 good copies were produced.

EXAMPLE 2

Example 1 was repeated except that a benzothiazole merocyanine dye, sensitizing to 633 nm, was used. The laminate was exposed in a Linotype 300 imagesetter. Similar results were obtained.

EXAMPLE 3

Grained and anodized aluminum/Mylar® laminate, made as in Example 1, was coated with a silver chlorobromide emulsion, sensitized to 488 nm with a merocyanine dye, to give a coat weight of 2.0 g/m². The silver to gelatin ratio was 1:1.5. The emulsion was overcoated with a cresol-formaldehyde resin at a coat weight of 0.5 g/m².

The laminate was imaged on a Scitex Raystar imagesetter, developed for 1 minute at 25° C. in developer B, and the unexposed areas were washed out in warm water.

| Developer B | |
|---|---|
| Pyrogallol | 3.0 g |
| Metol | 1.0 g |
| Sodium carbonate | 112.5 g |
| Potassium bromide | 1.5 g |
| Citric acid | 1.0 g |
| Sodium polymetaphosphate | 1.0 g |
| Water | to 1 liter |

The laminate was placed on a Rotaprint offset press. Satisfactory prints were obtained.

EXAMPLE 4

25 μm Aluminum foil was laminated to 125 μm Mylar® film. The laminate was cleaned in caustic soda solution, electrochemically grained in an electrolyte of hydrochloric and acetic acid by means of alternating current to give a CLA of 0.5 μm, anodized in a mixture of phosphoric and sulphuric acids to give an anodic weight of 3 g/m², and dipped in a 2% sodium metasilicate solution.

The laminated plate was coated with a mixture of a low gelatin silver iodobromide emulsion sensitized to 633 nm and an ammoniacal solution of a copolymer of ethyl acrylate (43%), methyl methacrylate (35%), methacrylic acid (10%), and 1-phenyl-3-methacrylamido-5-pyrazolone (12%) to give a coat weight of 1.5 g/m². The ratio of copolymer to silver was 1.5:1.

The laminated plate was imaged on a Linotype 500 imagesetter and developed for 60 seconds at 25° C. in developer C.

| Developer C | |
|---|---|
| Potassium bromide | 0.1 g |
| Potassium carbonate | 54 g |
| Potassium hydrogen carbonate | 54 g |
| Hydroxylamine hydrochloride | 10 g |
| Sodium sulphite | 0.45 g |
| Hydroquinone | 10 g |
| 4-Hydroxymethyl-4-methyl-1-phenyl-3-pyrazolidone | 0.11 g |
| Water | to 1 liter |

The unexposed areas were removed by washing with water. The dried plate was placed on a Heidelberg SORM-Z sheet fed press. Excellent print quality was obtained.

What is claimed is:

1. A method of preparing an imaged lithographic printing plate comprising, in sequence:
   (a) providing a roll of a printing plate precursor comprising:
      (i) a base substrate comprising a laminate of a 10 to 50 μm aluminum sheet and a 25 to 250 μm plastic sheet, and
      (ii) a photosensitive layer containing silver halide adhered to the aluminum;
   (b) imagewise exposing the photosensitive layer of said roll of printing plate precursor by means of a roll-fed imagesetter or phototypesetter; and
   (c) processing the exposed printing plate precursor to provide hydrophilic non-image areas and oleophilic image areas.

2. The method of claim 1 wherein the aluminum sheet is grained and anodized.

3. The method of claim 2 wherein the aluminum sheet has a thickness of 20 to 30 μm.

4. The method of claim 2 wherein the aluminum sheet is laminated to a polyethylene terephthalate plastic sheet.

5. The method of claim 4 wherein said plastic sheet has a thickness of 100 to 150 μm.

6. The method of claim 5 wherein said printing plate precursor is imaged by a Helium-Neon or Argon ion imagesetter or phototypesetter.

7. The method of claim 1 wherein in step (c) the silver halide is processed by diffusion transfer.

8. The method of claim 1 wherein in step (c) the silver halide is processed by tanning development.

* * * * *